(12) United States Patent
Kale et al.

(10) Patent No.: US 8,477,239 B2
(45) Date of Patent: *Jul. 2, 2013

(54) INTEGRATED LENS AND CHIP ASSEMBLY FOR A DIGITAL CAMERA

(75) Inventors: Vidyadhar Sitaram Kale, Lake Oswego, OR (US); Samuel Waising Tam, Daly City, CA (US); Dongkai Shangguan, San Jose, CA (US)

(73) Assignee: DigitalOptics Corporation, San Jose, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 12/930,822

(22) Filed: Jan. 18, 2011

(65) Prior Publication Data

US 2011/0115974 A1      May 19, 2011

Related U.S. Application Data

(63) Continuation of application No. 10/784,102, filed on Feb. 20, 2004, now Pat. No. 7,872,686.

(51) Int. Cl.
*H04N 5/225* (2006.01)
*H01L 23/02* (2006.01)
*H01L 21/00* (2006.01)

(52) U.S. Cl.
USPC .......................... 348/374; 257/680; 438/65

(58) Field of Classification Search
USPC ..... 348/374, 335, 340, 373; 257/680; 438/65, 438/59, 60
See application file for complete search history.

(56) References Cited

U.S. PATENT DOCUMENTS

| 5,617,131 | A  | * | 4/1997  | Murano et al. ............... 347/233 |
| 5,976,912 | A  |   | 11/1999 | Fukutomi et al. |
| 6,476,417 | B2 | * | 11/2002 | Honda et al. .................... 257/59 |
| 6,686,588 | B1 | * | 2/2004  | Webster et al. .............. 250/239 |
| 6,798,031 | B2 | * | 9/2004  | Honda et al. ................... 257/433 |

(Continued)

FOREIGN PATENT DOCUMENTS

| EP | 1434426 A2 | 6/2004 |
| EP | 1445803 A2 | 8/2004 |

(Continued)

OTHER PUBLICATIONS

CN Application No. 20058008990.2, Office Action dated Jul. 4, 2011 (English translation).

(Continued)

*Primary Examiner* — Aung S Moe
(74) *Attorney, Agent, or Firm* — Larry E. Henneman, Jr.; Gregory P. Gibson; Henneman & Associates, PLC

(57) ABSTRACT

A integrated camera module (10, 10a) for capturing video images in very small digital cameras, cell phones, personal digital assistants, and the like. A lens assembly (24, 24a) is rigidly affixed in relation to a sensor array area (14) of a camera chip (12) by a molding (26). The molding (26) is formed on the camera chip (12), and optionally on a printed circuit board (16, 16a) on which the camera chip (12) is mounted. The lens assembly (24, 24a) is held in place in a recess (29) of the molding (26) by an adhesive (28). The molding (26) is formed such that a precise gap (30) exists between the lens assembly (24) and a sensor array area (14) of the camera chip (12).

32 Claims, 8 Drawing Sheets

U.S. PATENT DOCUMENTS

| | | | |
|---|---|---|---|
| 7,061,106 B2* | 6/2006 | Yang et al. | 257/723 |
| 7,796,187 B2* | 9/2010 | Shangguan et al. | 348/374 |
| 7,872,686 B2* | 1/2011 | Kale et al. | 348/374 |
| 2002/0034022 A1* | 3/2002 | Nakamura | 359/819 |
| 2003/0057359 A1* | 3/2003 | Webster | 250/216 |
| 2003/0146998 A1* | 8/2003 | Doering et al. | 348/340 |
| 2003/0214021 A1 | 11/2003 | Zhou et al. | |
| 2004/0012698 A1* | 1/2004 | Suda et al. | 348/315 |
| 2004/0095502 A1* | 5/2004 | Losehand et al. | 348/340 |
| 2004/0164981 A1* | 8/2004 | Fujita et al. | 345/418 |
| 2004/0189853 A1* | 9/2004 | Takeuchi et al. | 348/340 |
| 2005/0046740 A1* | 3/2005 | Davis | 348/373 |
| 2005/0185088 A1 | 8/2005 | Kale et al. | |
| 2006/0044450 A1* | 3/2006 | Wolterink et al. | 348/340 |

FOREIGN PATENT DOCUMENTS

| | | |
|---|---|---|
| JP | 2001-188155 A | 7/2001 |
| JP | 2003-051973 A | 2/2003 |
| JP | 2005-210628 A | 8/2005 |
| JP | 2006-053232 A | 2/2006 |

OTHER PUBLICATIONS

CN Application No. 200910170632.1, Office Action dated Jan. 17, 2011 (English translation).
EP Application No. 10177430.5, European Search Report dated Nov. 15, 2010.
EP Application No. 10177430.5, Office Action dated Jul. 14, 2011.
JP Application No. 2006-554218, Office Action dated Dec. 3, 2009 (English translation).
U.S. Appl. No. 11/247,993, Office Action dated Jan. 6, 2010.
EP Application No. 06 816 608.1, European Search Report dated Mar. 10, 2010.
EP Application No. 06 816 608.1, Notice of Allowance dated May 19, 2011.
JP Application No. 2008-535619, Office Action dated Oct. 19, 2011 (English translation)
JP Application No. 2008-535619, Office Action dated May 14, 2012 (English translation).
JP Application No. 2008-535619, Office Action dated Nov. 19, 2012 (English translation).
TW Application No. 095135550, Office Action dated Mar. 17, 2011 (English translation).
TW Application No. 095135550, Office Action dated Jun. 30, 2011 (English translation).
TW Application No. 095135550, Office Action dated Aug. 10, 2012 (English translation).
TW Application No. 095135550, Notice of Allowance dated Nov. 26, 2012 (English translation).
U.S. Appl. No. 11/444,277, Office Action dated Mar. 1, 2011.
U.S. Appl. No. 11/444,277, Notice of Allowance dated Aug. 18, 2011.
CN Application No. 200780026542.4, Office Action dated Nov. 13, 2009 (English translation).
CN Application No. 200780026542.4, Office Action dated Apr. 27, 2011 (English translation).
CN Application No. 200780026542.4, Office Action dated Oct. 9, 2011 (English translation).
Japanese Application No. 2009-513308, Office Action dated Dec. 9, 2011 (English translation).
U.S. Appl. No. 13/214,696, Office Action dated Jan. 13, 2012.
U.S. Appl. No. 13/214,696, Office Action dated Apr. 23, 2012.

* cited by examiner

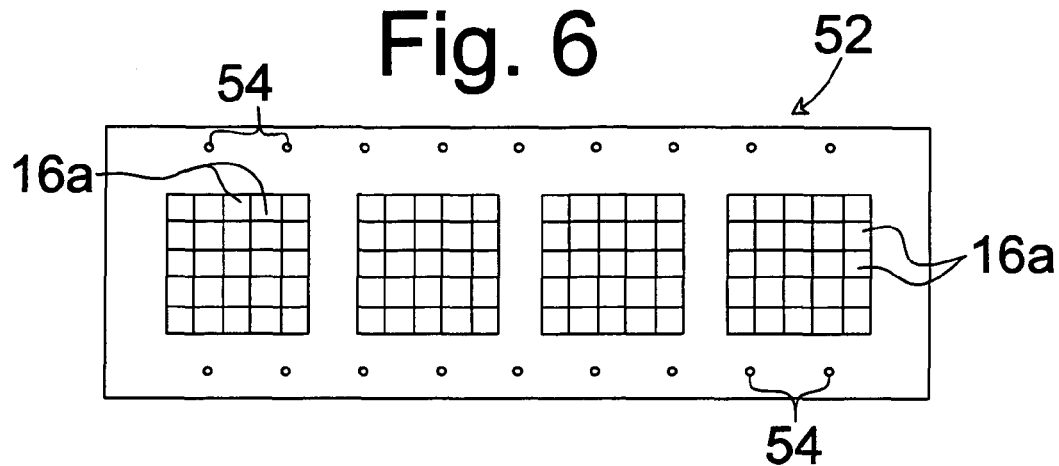
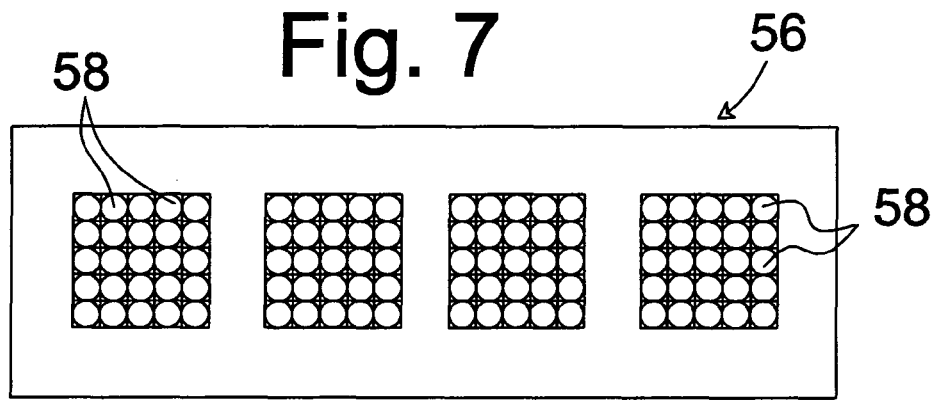
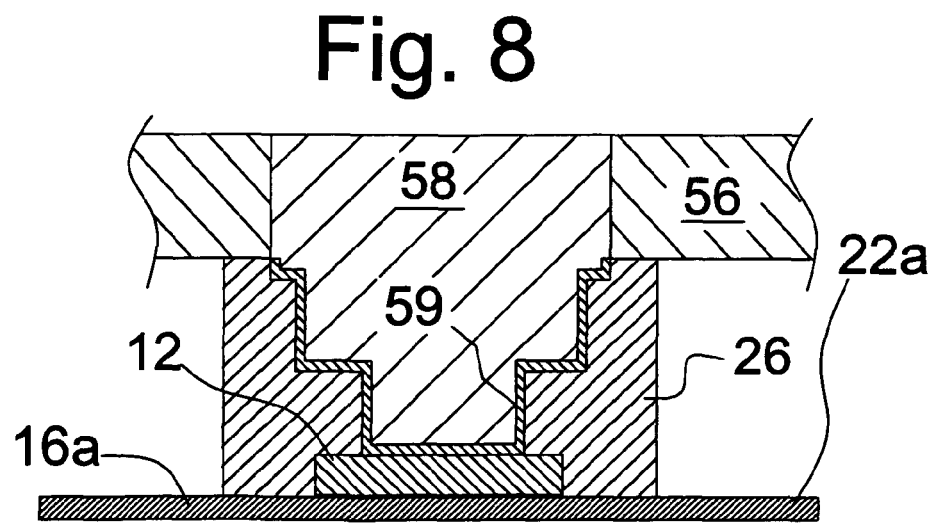

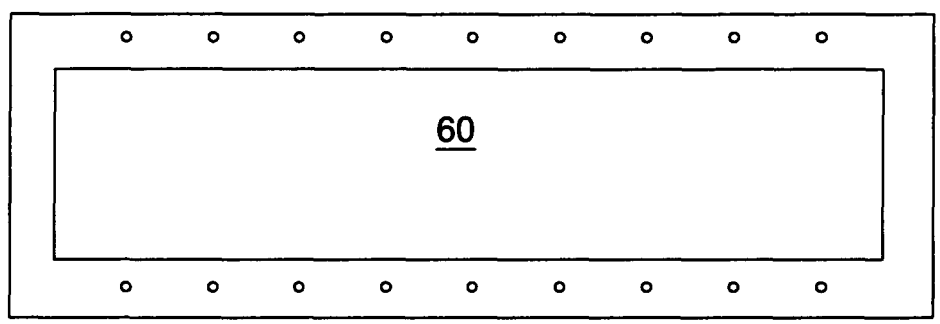
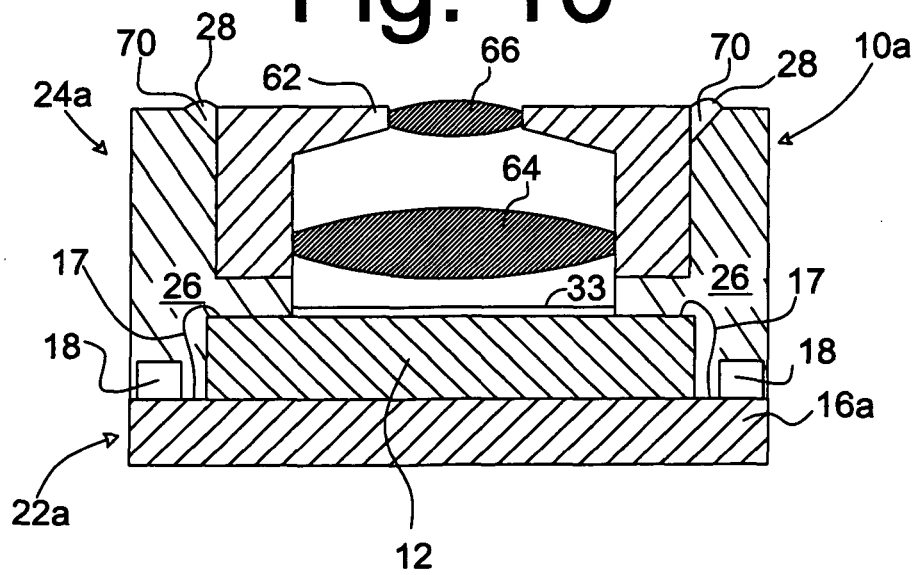

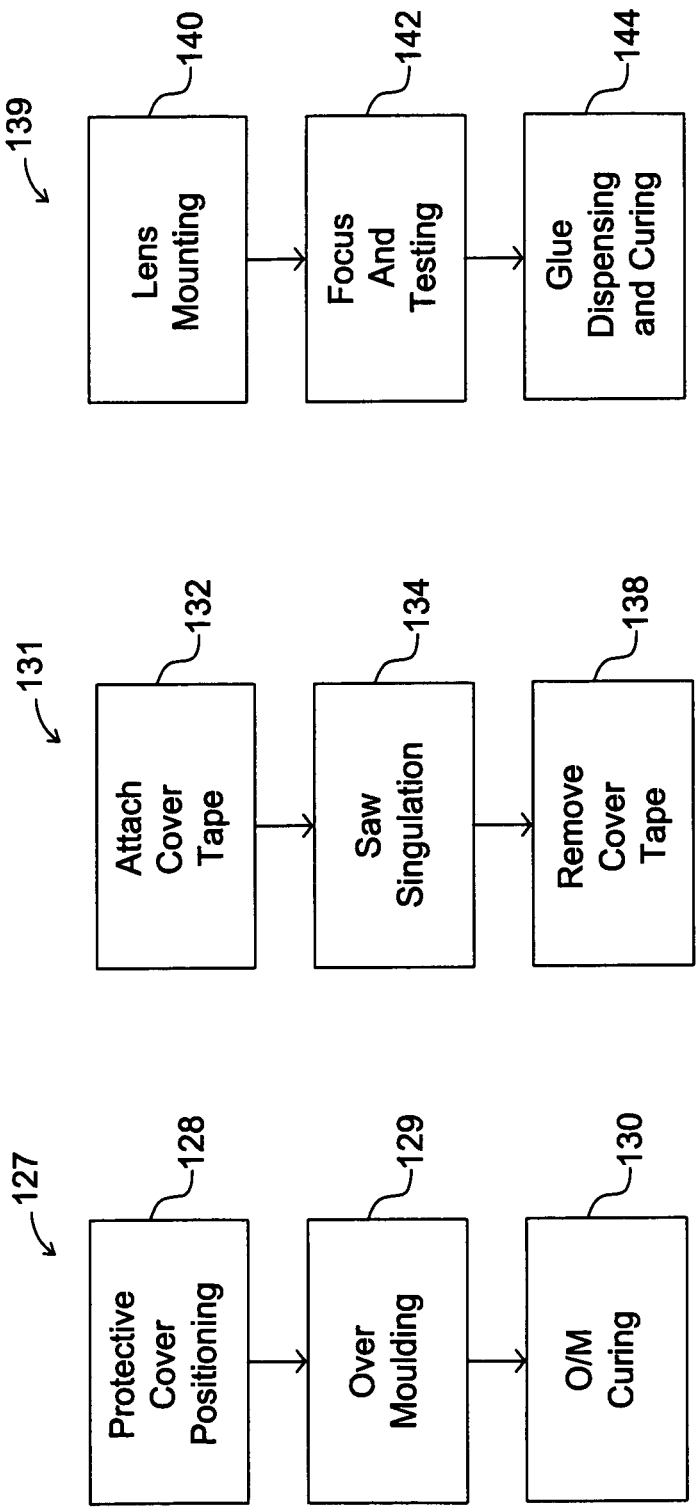

US 8,477,239 B2

INTEGRATED LENS AND CHIP ASSEMBLY FOR A DIGITAL CAMERA

RELATED APPLICATIONS

This application is a continuation of U.S. patent application Ser. No. 10/784,102, filed Feb. 20, 2004 by the same inventors, now U.S. Pat. No. 7,872,686, which is incorporated herein by reference in its entirety.

BACKGROUND OF THE INVENTION

1. Field of the Invention

The present invention relates generally to the field of digital camera devices, and more particularly to a novel combined array chip and lens apparatus. The predominant current application for the inventive integrated lens and chip assembly is in the production of low cost cameras, wherein the ability to produce high quality pictures without expensive or complicated camera assemblies is an important factor.

2. Description of the Background Art

Very small digital camera modules, adapted for use in small inexpensive cameras, cell phones, hand held devices, and the like, are greatly in demand. In the prior art, such modules have included generally conventional integrated chip and/or chip on board assemblies, which are enclosed in a mechanical housing. A lens block or assembly is attached to the chip housing and mechanically aligned thereto. This arrangement requires a significant quantity of parts used in the attachment process. It also generally requires some sort of attachment apparatus or jig for holding the pieces in alignment while they are attached. It is also very labor intensive. Additionally, the attachment mechanism is generally rather delicate and can easily be jarred out of position if the resulting device is dropped, or the like.

It would be desirable to have a method for producing a small camera module which is small in size, inexpensive to manufacture, and durable and reliable in operation. However, to the inventors' knowledge, the above described arrangement of components is that being used in the production of such devices prior to the advent of the presently described invention.

SUMMARY

Accordingly, it is an object of the present invention to provide a camera module which is easy and inexpensive to manufacture.

It is another object of the present invention to provide a camera module which can be very small in size.

It is still another object of the present invention to provide a camera module, which is rugged and reliable in operation.

It is yet another object of the present invention to provide a camera module in which the lens is accurately located, thereby providing for optimal picture quality without the need for active alignment.

Briefly, an example of the present invention has a lens assembly, which is rigidly affixed in relationship to a camera chip using a molded component. The molded component is formed in place on a printed circuit board on which the camera chip is already mounted. The lens assembly is then inserted into the molded component and held in place therein by an adhesive. According to the present inventive method and apparatus, a lens is accurately affixed in relationship to the sensor surface of the camera chip using a minimum of components and a minimum of operations steps. The size of the resulting unit can be quite small and the unit is also rugged and reliable in operation.

These and other objects and advantages of the present invention will become clear to those skilled in the art in view of the description of modes of carrying out the invention, and the industrial applicability thereof, as described herein and as illustrated in the several figures of the drawing. The objects and/or advantages listed or discussed herein are not an exhaustive list of all possible objects or advantages of the invention. Moreover, it will be possible to practice the invention even where one or more of the intended objects and/or advantages might be absent or not required in the application.

Further, those skilled in the art will recognize that various embodiments of the present invention may achieve one or more, but not necessarily all, of the above described objects and/or advantages. Accordingly, the listed objects and advantages are not essential elements of the present invention, and should not be construed as limitations.

BRIEF DESCRIPTION OF THE DRAWINGS

FIG. 6 is a top plan view of a substrate strip such as can be used to implement the present invention;

FIG. 7 is a top plan view of a molding chase such as can be used to implement the present invention;

FIG. 8 is a cross sectional side elevational view of one of the mold inserts of FIG. 7;

FIG. 9 is a top plan view showing the substrate strip of FIG. 6 with a protective tape in place thereon;

FIG. 10 is a cross sectional side elevational view of an alternative example of the inventive integrated camera and lens assembly;

FIG. 13 is a flow chart summarizing one particular method for performing an overmolding lens mount step of FIG. 11;

FIG. 14 is a flow chart summarizing one particular method for performing a device separation step of FIG. 11; and FIG. 15 is a flow chart summarizing one particular method for performing a lens mounting step of FIG. 11.

DETAILED DESCRIPTION OF THE INVENTION

Figure 1:
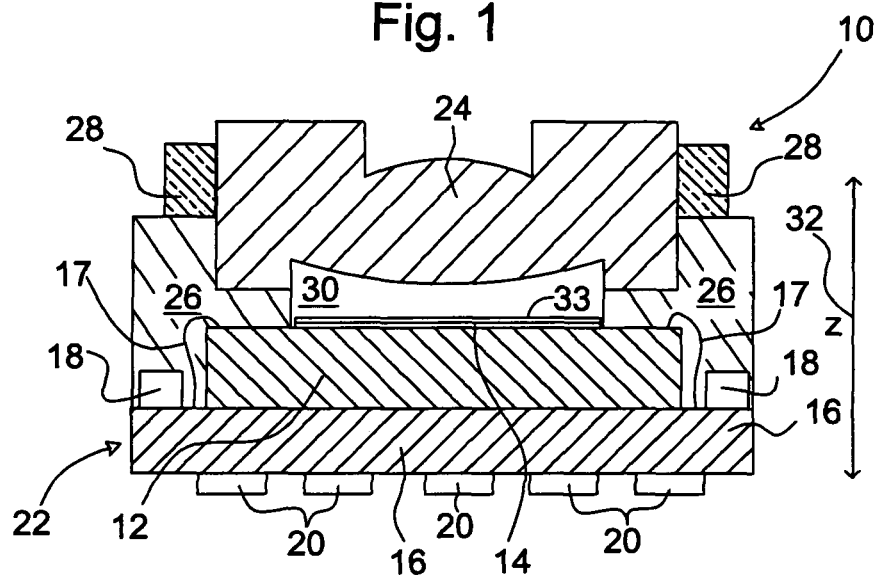
FIG. 1 is a cross sectional side elevational view of an example of an integrated camera and lens assembly according to the present invention.

This invention is described in the following description with reference to the Figures, in which like reference numbers represent the same or similar elements. While this invention is described in terms of modes for achieving this invention's objectives, it will be appreciated by those skilled in the art that variations may be accomplished in view of these teachings without deviating from the spirit or scope of the present invention. The embodiments and variations of the invention described herein, and/or shown in the drawings, are presented by way of example only and are not limiting as to the scope of the invention. Unless otherwise specifically stated, individual aspects and components of the invention may be omitted or modified, or may have substituted therefore known equivalents, or as yet unknown substitutes such as may be developed in the future or such as may be found to be acceptable substitutes in the future. The invention may also be modified for a variety of applications while remaining within the spirit and scope of the claimed invention, since the range of potential applications is great, and since it is intended that the present invention be adaptable to many such variations.

In the following description, details of some well known and/or commonly commercially available component parts have not been specifically discussed in detail, so as to avoid unnecessary complexity which might obscure disclosure of the true nature of the present invention. It should be noted that the diagrammatic representations in the drawings accompanying this description are not necessarily drawn in the scale and proportion which might be used in the actual practice of the invention. Rather the drawings are intended only to demonstrate the relative arrangement of certain aspects of the invention and to assist in the understanding of the important inventive aspects.

A known mode for carrying out the invention is an integrated camera module. The inventive integrated camera module is depicted in a side elevational view in FIG. 1 and is designated therein by the general reference character 10. The integrated camera module 10 has a camera chip 12 which is, in and of itself, not different from other camera chips such as are now in use or such as might be developed in the future. One skilled in the art will recognize that the camera chip 12 will have thereon a sensor array area 14 and will also contain many of the additional components (timing, and the like) necessary or desirable for causing the sensor array area 14 to capture an image. In the example of FIG. 1 the camera chip 12 is attached (as will be discussed in greater detail hereinafter) to a printed circuit board ("PCB") 16. The camera chip 12 is electrically connected to the PCB 16 by a plurality (only two of which are visible in the view of FIG. 1) of wire bond attachment wires 17.

The PCB 16 has thereon a plurality of passive components 18 which, in conjunction with components on the camera chip 12, constitute the internal circuitry of the integrated camera module 10. Optionally, the PCB 16 can, in some applications, have a plurality (only a few of which are shown in the view of FIG. 1 for the sake of clarity) of bottom contact pads 20 for connecting the integrated camera module 10 electrically to external components (not shown), such as an operating button, optional flash circuitry, external digital memory, external control circuitry, or the like. Together, the above described components form a PCB assembly 22 which, in many respects, is not significantly different from those currently in use in similar camera modules.

According to the present invention, a lens assembly 24 is positioned in relation to the PCB assembly 22 by a molding 26 and held in place therein by an adhesive 28. The molding 26 is formed by a molding material on the PCB assembly 22 as will be discussed in greater detail hereinafter. The molding 26 has dimensional tolerances sufficiently accurate such that when the lens assembly 24 is positioned within a recessed area 29 (FIG. 2) in the molding 26, as shown in the example of FIG. 1, then a gap 30 is appropriate for the focus of the lens assembly 24 in relation to the PCB assembly 22. As shown in FIG. 1, a spacer portion of the molding 26 separates the lens assembly 24 and the camera chip 12. Optimal distance between the lens assembly 24 and the sensor array 14 is determined by the geometry and materials of the particular lenses used. The height of the gap 30 is a function of the placement of the lens assembly 24 in a Z dimension 32, as can be seen in the view of FIG. 1, which placement will be discussed in greater detail hereinafter.

Note that lens assembly 24 is not intended to depict any particular lens design, but rather is shown representationally for illustrative purposes. Depending on the particular design, lens assembly 24 can be formed from a single piece of material, can include one or more lenses mounted in a carrier (e.g., FIG. 10), or can include additional optical components.

A protective cover 33 is mounted over sensor array area 14, to protect sensor array area 14 from damage during the manufacturing and assembly process. Preferably, protective cover 33 is formed from a robust, optically inactive material. In one particular embodiment, protective cover is a glass cover sheet, which can be mounted over sensor array area 14 either before or during the formation of molding 26.

Figure 2:
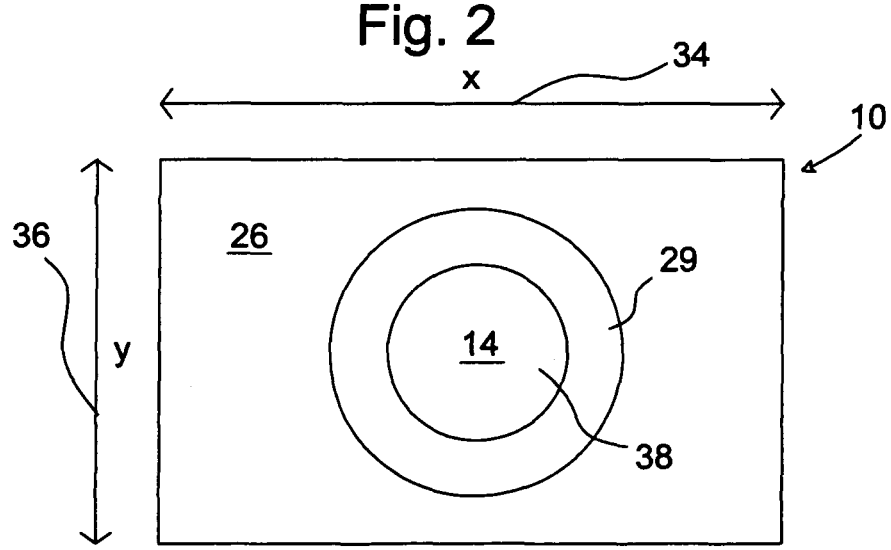
FIG. 2 is a top plan view of a partially assembled integrated camera and lens assembly according to the present invention.

FIG. 2 is a diagrammatic top plan view of the integrated camera module 10 of FIG. 1 before the lens assembly 24 is positioned thereon. As can be seen in the view of FIG. 2, placement of the lens assembly 24 (FIG. 1) in an X dimension 34 and a Y dimension 36 is accomplished by the position and tolerances of the recessed area 29 in the molding 26. An aperture 38 in the molding 26 is provided such that the sensor array area 14 can be seen there through.

Figure 3:
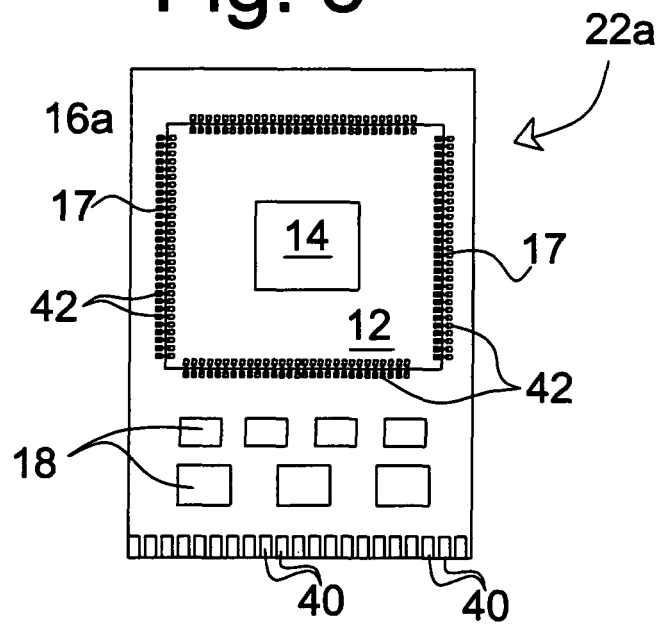
FIG. 3 is a top plan view of another example of a PCB assembly according to the present invention.

FIG. 3 is a top plan view of another example of a PCB assembly 22a. In the example of FIG. 3 it can be seen that the camera chip 12 is affixed (by an adhesive, in this example) to the alternate PCB 16a. A great plurality of the attachment wires 17 are connected to a like plurality of attachment pads 42 on the alternate PCB 16a for making electrical connection between the alternate PCB 16a and the camera chip 12. The alternate PCB assembly 22a also has a plurality of attachment fingers 40 thereon for electrically connecting the alternate PCB assembly 22a to external circuitry. Unlike the example of FIG. 1, in the example of FIG. 3, all of the passive components 18 are located on one side of the camera chip 12.

Figure 4:
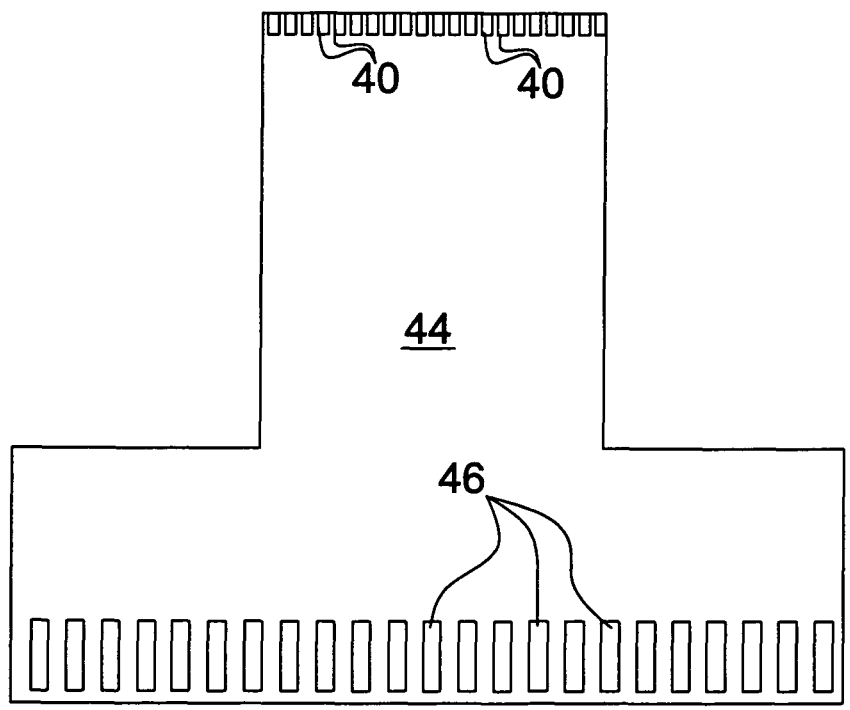
FIG. 4 is a bottom plan view of a flexible connector according to the present invention.

FIG. 4 is as bottom plan view of a flex circuit 44. The flex circuit 44 has a plurality of the attachment fingers 40 thereon for mating with the like plurality of attachment fingers 40 on the alternate PCB assembly. Furthermore, the flex circuit 44 has a plurality of edge connector pads 46 for connection to external circuitry.

Figure 5:
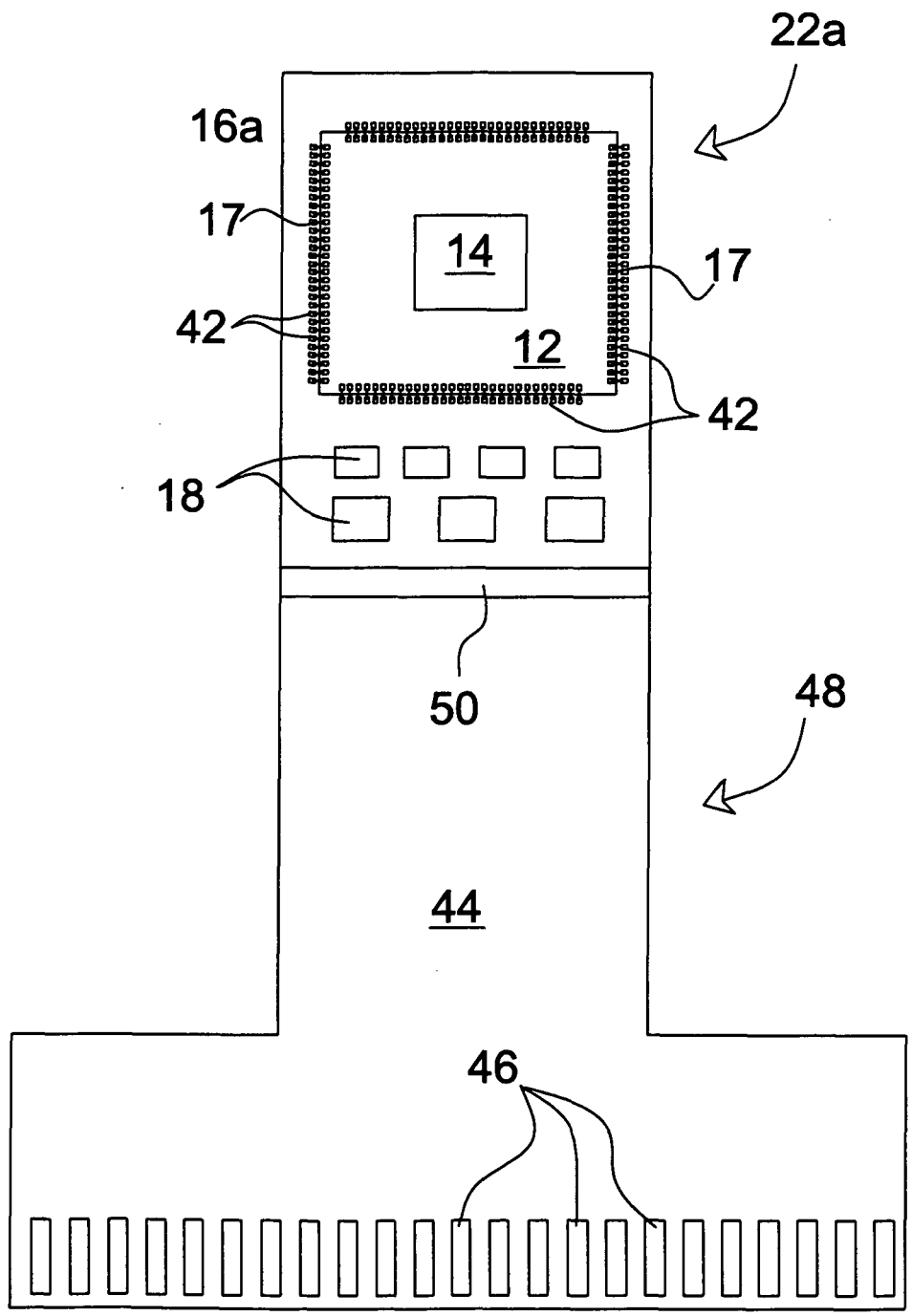
FIG. 5 is a top plan view of an assembled flexible PCB apparatus.

FIG. 5 is a top plan view of an assembled flex circuit assembly 48 having the alternate PCB assembly 22a of FIG. 3 affixed to the flex circuit 44 of FIG. 4. It should be noted that the alternate PCB assembly 22a could be attached directly to a rigid circuit board, or the like, without the flex circuit 44. However, in some applications, the flex circuit 44 will allow more freedom in the placement of the alternate PCB assembly 22a. Furthermore, additional circuitry can be included on the flex circuit 44 as may be necessary or required. The flex circuit 44 will include traces (not shown) for providing electrical connection between the attachment fingers 40 and the edge connector pads 46 and, as discussed above, optional additional circuitry as required. In the view of FIG. 5 it can be seen that, in the flex circuit assembly 48, the alternate PCB assembly 22a is connected to the flex circuit 44 at a hot bar attachment point 50 such that the attachment fingers 40 (not visible in the view of FIG. 5) mate as required. One skilled in the art will be familiar with the hot bar attachment method whereby the components are joined at the hot bar attachment point 50.

FIG. 6 is a top plan diagrammatic view of a substrate strip 52. The substrate strip 52 has a plurality (100 in the example shown) of the individual PCBs 16a included therein. The substrate strip 52 also has a plurality (18 in this example) of alignment holes 54 for aligning the substrate strip 52 in one or more placement jigs (not shown).

FIG. 7 is a top plan diagrammatic view of a mold chase 56 such as might be used to accomplish the present invention. The mold chase 56 is constructed of a metal such as stainless steel. The mold chase as adapted for holding in place a plurality (100 in this example) of mold inserts 58. The mold inserts 58 are positioned such that one mold insert 58 is correctly aligned over each of the PCBs 16a on the substrate strip 52 (FIG. 6) when the mold chase 56 is aligned over the substrate strip 52.

FIG. 8 is a diagrammatic side elevational view of one of the mold inserts 58 in position over one of the alternate PCB assemblies 22a. As will be discussed in greater detail hereinafter, the alternate PCB assemblies 22a are constructed on the substrate strip 52, except as noted herein, before the substrate strip 52 is separated into the individual alternate PCB assemblies 22a. As can be seen in the view of FIG. 8, mold insert 58 is coated with a compliant, nonadherent layer of material 59, to prevent damage to the underlying sensor 12 and/or to prevent adhesion of the molding 26 material to mold insert 58. The specific material used for coating 59 will depend on the specific composition of molding 26, as is known to those skilled in the art, and in some applications, coating material 59 can be omitted. Thus, coating material 59 is not considered to be an essential element of the present invention. It should be noted that the molding process, itself, is not peculiar to the present invention. In place molding techniques are well known in the art, and one skilled in the art will be familiar with the details necessary to properly form the molding 26 and equivalents discussed herein.

FIG. 9 is a top plan view of an example of the substrate strip 52 with a protective tape 60 in place thereon to protect the PCB assemblies 16a (not visible in the view of FIG. 9) during some assembly of the invention. Use of the protective tape 60 will be discussed in greater detail hereinafter in relation to the inventive method for producing the integrated camera module 10.

FIG. 10 is yet another example of an integrated camera module 10a according to the present invention. In the view of FIG. 10 it can be seen that an alternate lens assembly 24a has a plastic lens housing 62, a first lens 64 and a second lens 66. One skilled in the art will recognize that the integrated camera module 10a will generally require two lenses. Therefore, an arrangement such as is illustrated in the view of FIG. 10 is considered by the inventors to be optimal. However, the invention can be practiced using only one lens. The distance between the first lens 64 and the second lens 66 is fixed by the construction of the lens housing 62. The distance between the first lens 64 and the camera chip 12 is set as will be discussed hereinafter. In the example of FIG. 10, an adhesive well 70 is provided around the circumference of the molding 26 for accepting the adhesive 28 which holds the lens assembly 24a in place within the molding 26.

Figure 11:
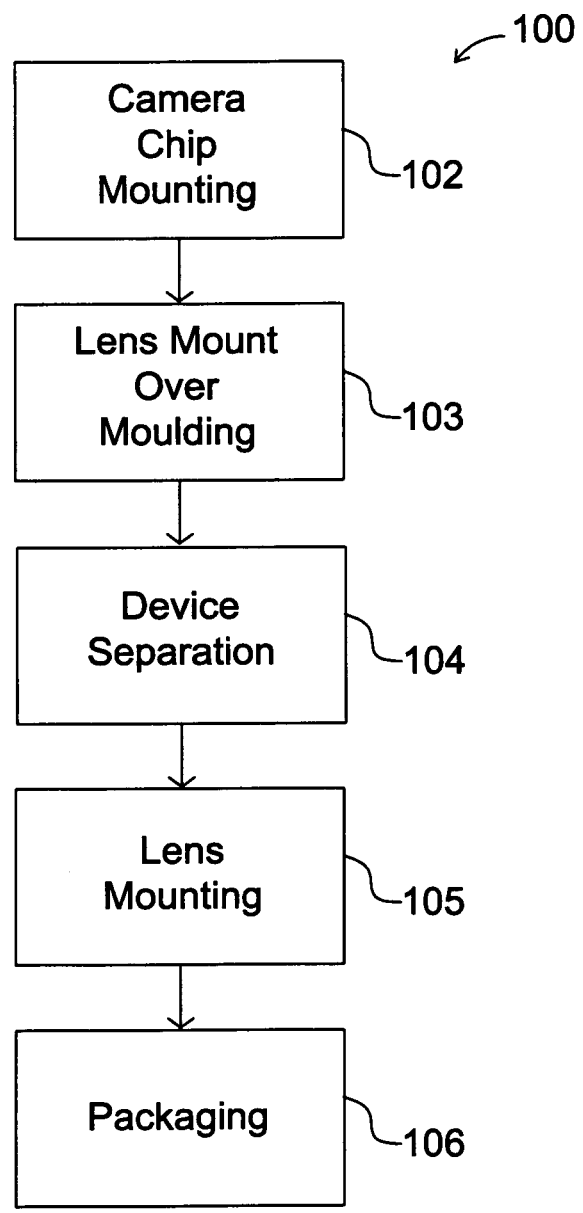
FIG. 11 is a flow diagram depicting the inventive method for producing an integrated camera and lens assembly.

FIG. 11 is a flow diagram depicting an example of the present inventive camera module construction method 100. In this particular example, a plurality of camera modules are constructed at the same time. First, in a "camera chip mounting" operation 102, one or more camera chips 12 are mounted to one or more PCBs 16a, respectively (FIG. 6). Next, in a "lens mount overmolding" operation 103, a lens mount 26 is molded over each camera chip 12. Then, in a "device separation" operation 104, the PCBs 16a are separated (e.g., sawn apart) from one another. Next, in a "lens mounting" operation 105, a lens housing 62 is mounted into each lens mount molding 26 (FIG. 10). Finally, in a "packaging" operation 106, the completed integrated camera modules 10a are packaged for shipment to the makers of miniature cameras, telephone cameras, and the like, or optionally for attachment to the flex circuit 44 as previously discussed herein.

Figure 12:
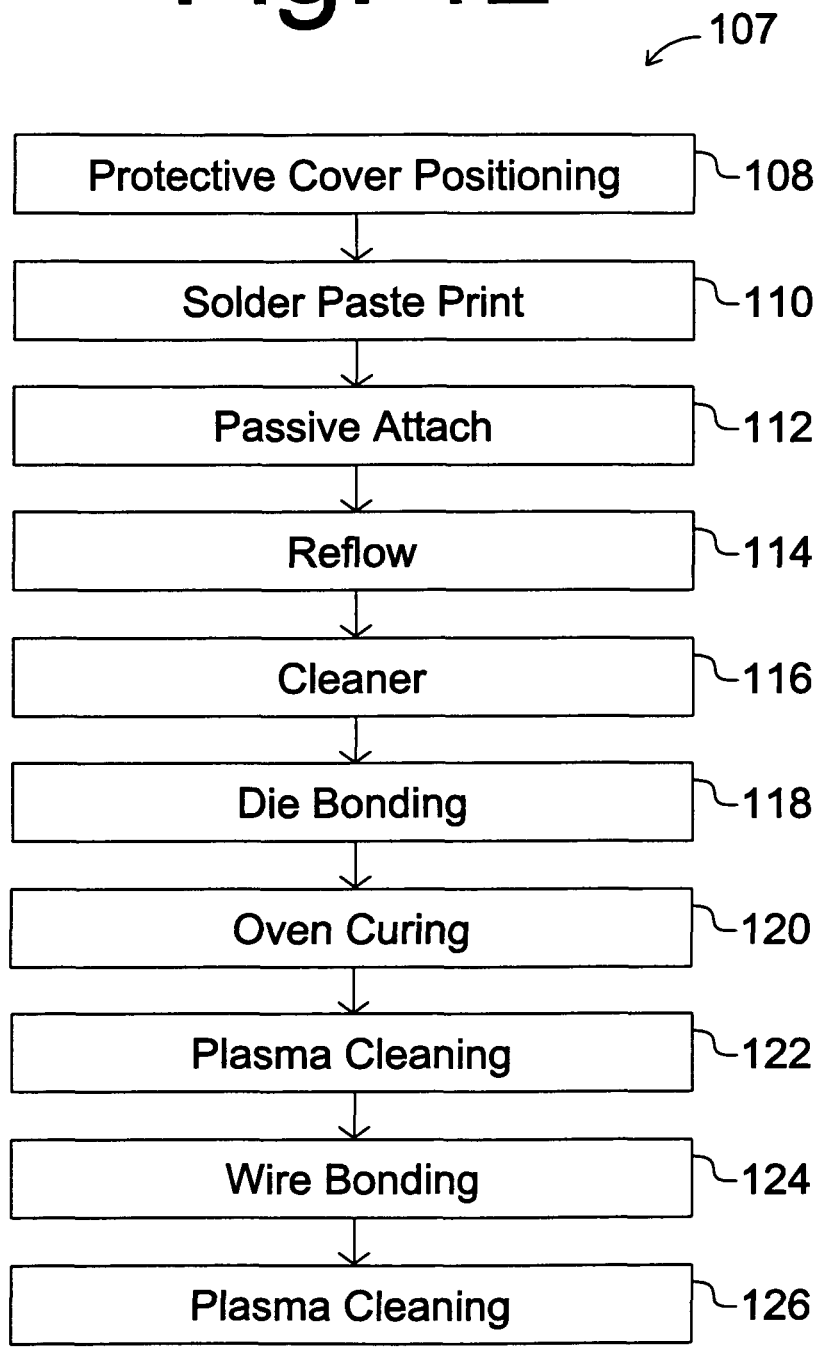
FIG. 12 is a flow chart summarizing one particular method for performing a camera chip mounting step of FIG. 11.

FIG. 12 is a flow chart summarizing one particular method 107 for performing camera chip mounting operation 102 of method 100. First, in a "protective cover position" operation 108, protective cover 33 is positioned over camera chip 12 (FIG. 10). Optionally, protective cover 33 can be positioned during lens mount overmolding operation 103, at another point in camera chip mounting operation 102, or omitted. Next, in a "solder paste print" operation 110 solder paste traces are printed on the individual PCBs 16a of the substrate strip 52. In a "passive attach" operation 112 the passive components 18 are placed on the PCBs 16a. In a "reflow" operation 114, the substrate strip 52 is subjected to a reflow soldering operation, and in a "cleaner" operation 116, the substrate strip 52 is subjected to conventional cleaning following the reflow soldering process 114.

In a "die bonding" operation 118 the camera chips 12 are bonded (by an adhesive in this example) to the respective PCBs 16a. In an "oven curing" operation 120, the adhesive applied in the previous operation is cured in an oven. In a "plasma cleaning" operation 122 surfaces to which wires are to be bonded (in subsequent operations) are etched using inert gasses. In a "wire bonding" operation 124 the attachment wires 17 are bonded using thermosonic bonding. In a second "plasma cleaning" operation 126 the PCBs 16a are again cleaned.

FIG. 13 is a flow chart summarizing one particular method 127 of performing lens mount overmolding operation 103 of method 100. In a protective cover positioning operation 128, protective cover 33 is positioned over camera chip 12. Note that this step is unnecessary if protective cover 33 has already been mounted as part of a prior process, or if no protective cover is desired. Then, in an "over molding" operation 129, the mold chase 56 is placed over the substrate strip 52 and the molding 26 is formed as previously discussed herein. In addition to the functionality already described herein, molding 26 can also serve to hold protective covering 33 in place, essentially sealing in the sensor array area 14 of camera chip 12. The molding 26 is formed using generally conventional "overmolding" techniques known to those skilled in the art. The mold will provide for exposure of the sensor array area 14 of the camera chip 12 after the molding operation. Finally, in an "O/M curing" operation 130, the molding 26 is briefly heat cured.

FIG. 14 is a flow chart summarizing one particular method 131 of performing device separation operation 104 of FIG. 11. First, the protective tape 60 is placed over all of the PCBs 16a (as illustrated in FIG. 9) in an "attach cover tape" operation 132. Then, in a "saw singulation" operation 134, the individual PCBs 16a are sawn apart. The sawing is done right through the protective tape 60 such that the resulting product is a plurality of the individual PCB assemblies 22a, each having a respective portion of the protective tape 60 still in place thereon. The protective tape 60 is a commonly available commodity provided for protecting components during a soldering process, and the like. Finally, in a "remove cover tape" operation 138, the bits of the protective tape 60 are removed from each of the PCB assemblies 22a.

FIG. 15 is a flow chart summarizing one particular method 139 of performing lens mounting operation 105 of method 100. In a "lens mounting" operation 140, one of the lens assemblies 24a is inserted into each of the moldings 26 (FIG. 10). In a "focus and testing" operation 142, the lens assembly 24a is moved up and down (along the Z axis 32 of FIG. 1) to perfect the focus of the lens assembly 24a in relation to the sensor array area 14 of the camera chip 12. Correct focus is determined by generally conventional automatic testing equipment. It should be noted that the inventors believe that this operation might be eliminated in the future by referencing the position of the mold chase 56 in relation to the camera chip 12 during the "over molding" operation 128. Finally, in a "glue dispensing and curing" operation 144, ultra violet cure adhesive 28 is applied as previously discussed herein, and then cured using ultra violet light.

Various modifications may be made to the invention without altering its value or scope. For example, the sizes, shapes and quantities of components shown and described in relation to the examples discussed herein could each or all be varied according the needs or convenience of a particular application.

Similarly other substrate materials, such as ceramics, could be used instead of the PCB 16 described herein.

Another modification would be to replace the air filled gap 30 described herein with an optically clear spacer made, for example, of clear plastic, glass, or some other optically acceptable material. Providing a spacer which abuts both the camera chip 12 and the lens 24 could eliminate the need to focus the lens during the lens mounting operation. Also, secondary lenses, such as zoom lens assemblies and the like, can be fit to the already mechanically centered lens assembly 24 or 24a. A spacer would also serve as a protective cover, thereby eliminating the need to provide a separate protective cover.

While the inventors presently believe that mounting the lens assemblies 24, 24a into the molding 26, or the like, by an adhesive is presently the most viable method, it is within the scope of the invention that the lens assemblies 22, 22a could be secured to the PCB 16, 16a in relation to the camera chip 12 by other mechanical means, such as a mechanical clip, or the like.

Obvious variations to the method could include mounting the lens assemblies 24a into the molding 26 before the "saw singulation" operation 134. Of course, this would require some other modifications to the method to insure that the sensor array area 14 is protected during the "saw singulation" operation 134, and the like.

Additional components and/or parts could readily be added to the present invention. One possible example would be to provide a glass cover on the molding 26. Such as cover might serve several purposes. It could protect the sensor array area 14 during storage, transport and handling, it could optionally provide a service whereby the device could be lifted by "pick-and-place" machines, and it could protect the sensor array area 14 during reflow soldering operations.

All of the above are only some of the examples of available embodiments of the present invention. Those skilled in the art will readily observe that numerous other modifications and alterations may be made without departing from the spirit and scope of the invention. Accordingly, the disclosure herein is not intended as limiting and the appended claims are to be interpreted as encompassing the entire scope of the invention.

INDUSTRIAL APPLICABILITY

The inventive integrated camera module 10, 10a is intended to be widely used for capturing visual images in very small devices such as small digital cameras, cellular telephones, and the like. The device and method are appropriate to a wide variety of applications, including using sensor modules ranging from VGA resolution to 1.3 Megapixel or even greater. The method and apparatus described herein are inexpensive in the molding material and process is lower in cost as compared to the attachment of a housing conventional methods. This is mainly because the molding process will be performed on an entire panel having thereon a large number of the integrated camera modules 10 at once, rather than attaching the lenses one at a time. Also, the cost of molding compound will be lower than the cost of individual housing pieces formerly used for attaching the lenses.

According to the present invention, the final assembly of the integrated camera modules 10 will be more robust and more accurate with respect to X and Y locations. This is accomplished by ensuring that the sensor die placement and the overmold insert locations are controlled by the same local fiducial features on the substrate. Current methods involve use of guide pins and other means for the placement of the housing. These inherently involve greater tolerance build up compared to a mold with greater dimensional accuracy and more stable dimensions.

As discussed previously herein, Z dimension accuracy will be accomplished with reference to the camera chip 12 surface itself, which is the key reference for camera focus. It is anticipated that, in the future, this will obviate the need for active alignment in most cases. Also, the fact that the alignment is done without having to rotate the lens assembly into a threaded housing will inherently make the lens placement more stable.

It is further anticipated that the reduction in the required number of components according to the present invention will, itself, result in additional cost savings.

Since the integrated camera module 10, 10a of the present invention may be readily produced and integrated with existing design configurations for camera systems and others yet to be conceived, and since the advantages as described herein are provided, it is expected that it will be readily accepted in the industry. For these and other reasons, it is expected that the utility and industrial applicability of the invention will be both significant in scope and long-lasting in duration.

We claim:

1. A method for manufacturing camera modules, said method comprising:
providing a substrate including a plurality of discrete printed circuit boards;
affixing a plurality of camera integrated circuit chips to said substrate, each of said camera integrated circuit chips affixed on a respective one of said plurality of discrete printed circuit boards; and
forming a plurality of moldings on said substrate, each of said moldings defining a receptacle for receiving a lens within the receptacle and being formed on a respective one of said plurality of printed circuit boards and on said respective one of said camera integrated circuit chips.

2. A method according to claim 1, further comprising placing a plurality of protective covers, each of said plurality of protective covers placed over a respective one of said plurality of camera integrated circuit chips.

3. A method according to claim 2, wherein said step of placing said plurality of protective covers occurs during said step of forming said plurality of moldings.

4. A method according to claim 2, wherein said step of forming said plurality of moldings further includes forming at least one of said plurality of moldings with a projection such that said projection contacts said respective one of said protective covers, thereby sealing a photosensitive array of said respective camera integrated circuit chip.

5. A method according to any of claim 1, wherein:
said step of forming said plurality of moldings includes forming said plurality of moldings with a mold chase;

said mold chase includes a plurality of mold inserts, each of said mold inserts having a compliant surface; and said step of forming said plurality of moldings includes contacting a top surface of each of said plurality of said camera integrated circuit chips with said compliant surface of a respective one of said plurality of mold inserts.

6. A method according to claim 1, further comprising mounting a plurality of lenses within said plurality of moldings while said plurality of discrete printed circuit boards are still an integral part of said substrate, each of said plurality of lenses being mounted within said receptacle of a respective one of said plurality of moldings.

7. A method according to claim 6, further comprising focusing each of said plurality of lenses while said plurality of discrete printed circuit boards are still an integral part of said substrate.

8. A method according to claim 6, further comprising securing said plurality of lenses to said respective ones of said plurality of moldings with an adhesive while said plurality of discrete printed circuit boards are still an integral part of said substrate.

9. A method according to claim 6, wherein said step of forming said plurality of moldings includes forming each of said plurality of moldings with a projection, said projection fixing the distance between said respective one of said lenses and said respective one of said camera integrated circuit chips.

10. A method according to claim 6, further comprising:
placing an optically clear spacer within said receptacle of each of said plurality of moldings, said optically clear spacer disposed adjacent a top surface of said respective camera integrated circuit chip; and wherein
each said optically clear spacer separates one of said lenses and a respective one of said camera integrated circuit chips when said lenses are placed in said receptacles after said optically clear spacers; and
said optically clear spacers abut both respective ones of said lenses and respective ones of said camera integrated circuit chips.

11. A method according to claim 10, wherein said step of placing said optically clear spacer within said receptacle of each of said plurality of moldings occurs during said step of forming said plurality of moldings.

12. A method according to claim 6, wherein said step of mounting said plurality of lenses includes mounting a plurality of lens assemblies within said plurality of moldings while said plurality of discrete printed circuit boards are still an integral part of said substrate.

13. A method according to claim 1, wherein:
each of said moldings is made directly on said respective one of said plurality of camera integrated circuit chips; and
each of said plurality of moldings abuts said respective one of said plurality of camera integrated circuit chips on at least two surfaces of said respective one of said plurality of camera integrated circuit chips.

14. A method according to claim 1, further comprising separating said plurality of discrete printed circuit boards after said step of forming said plurality of moldings.

15. A method according to claim 1, further comprising performing a solder reflow operation after said step of forming said moldings on said substrate.

16. A method according to claim 1, wherein each of said plurality of moldings contacts said respective one of said plurality of printed circuit boards and said respective one of said camera integrated circuit chips.

17. A plurality of camera modules manufactured by the method of claim 1.

18. A substrate comprising:
a plurality of discrete printed circuit boards;
a plurality of camera integrated circuit chips, each of said plurality of camera integrated circuit chips affixed to a respective one of said plurality of discrete printed circuit boards; and
a plurality of moldings, each of said plurality of moldings defining a receptacle for receiving a lens within the receptacle and being formed on a respective one of said plurality of printed circuit boards and said respective camera integrated circuit chip.

19. A substrate according to claim 18, further comprising a plurality of protective covers, each of said protective covers disposed over a respective one of said camera integrated circuit chips.

20. A substrate according to claim 19, wherein said protective covers are molded spacers.

21. A substrate according to claim 19, wherein said protective covers are glass.

22. A substrate according to claim 18, further comprising a plurality of lenses, each of said lenses mounted within said receptacle of a respective one of said plurality of moldings.

23. A substrate according to claim 22, wherein at least one of said plurality of moldings includes a projection for fixing the distance between a respective one of said lenses and said respective one of said camera integrated circuit chips.

24. A substrate according to claim 23, further comprising:
a plurality of protective covers each disposed over a respective one of said camera integrated circuit chips; and
said projection holds said protective cover in place such that said projection and said protective cover seal a sensor array of said respective one of said camera integrated circuit chips.

25. A substrate according to claim 22, wherein at least one of said lenses is housed within a lens assembly.

26. A substrate according to claim 22, wherein each of said lenses is mounted within said respective one of said plurality of moldings such that there is a gap between at least a portion of said lens assembly and a photosensitive array of said respective camera integrated circuit chip.

27. A substrate according to claim 22, wherein each of said lenses is held in place on said respective one of said moldings by an adhesive.

28. A substrate according to claim 22, further comprising a plurality of optically clear spacers, each of said optically clear spacers disposed within said receptacle of a respective one of said plurality of moldings and separating said lens and said camera integrated circuit chip of said respective one of said plurality of moldings.

29. A substrate according to claim 28, wherein said spacer fixes the distances between said lens and said camera integrated circuit chip of said respective one of said plurality of moldings.

30. A substrate according to claim 18, wherein each of said plurality of moldings is made from a material capable of withstanding a subsequent solder reflow operation.

31. A substrate according to claim 18, wherein each of said plurality of moldings abuts said respective camera integrated circuit chip on at least two surfaces of said camera integrated circuit chip.

32. A substrate according to claim 18, wherein each of said plurality of moldings contacts said respective one of said plurality of printed circuit boards and said respective camera integrated circuit chip.

* * * * *